TUNNEL DIODE DEVICES

Original Filed Aug. 19, 1963 2 Sheets-Sheet 1

INVENTOR
SAMUEL S. IM

BY Harry M Weiss
ATTORNEY

United States Patent Office 3,475,071
Patented Oct. 28, 1969

3,475,071
TUNNEL DIODE DEVICES

Samuel S. Im, Poughkeepsie, N.Y., assignor to International Business Machines Corporation, New York, N.Y., a corporation of New York Original application Aug. 19, 1963, Ser. No. 302,991. Divided and this application Feb. 25, 1966, Ser. No. 553,588
Int. Cl. H01l 5/00, 11/00, 3/00
U.S. Cl. 317—234 4 Claims

ABSTRACT OF THE DISCLOSURE

A tunnel diode device having a pair of tunnel diodes formed on a degenerately doped substrate of semiconductor material of one conductivity type. The pair of diodes consists of a pair of regions which are alloys of metal and said semiconductor material degenerately doped with opposite conductivity type impurities formed in a pair of apertures of widely differing diameters in a film of insulating material adherent to the surface of said substrate. The pair of alloy regions form tunnelling junctions with the substrate which extend below the surface of the substrate. The highly doped substrate reversely couples the diode pair.

The present invention is directed to semiconductor devices and the methods of fabrication thereof. More particularly, the invention relates to tunnel diode devices and their manufacture.

This is a division of application Ser. No. 302,991, filed Aug. 19, 1963.

The tunnel diode, like the conventional semiconductor diode, is a two-terminal semiconductor device comprising a semiconductor body or region of one conductivity type separated from another region of the opposite type by a rectification barrier or junction. Unlike the conventional semiconductor diode, the tunnel diode has an abrupt junction with degenerate doping on both sides of that junction, the doping level being of the order of $1\times10^{19}$ to $2\times10^{20}$ impurity atoms per cubic centimeter or greater. This is about four or five orders of magnitude greater than the doping level found in the usual semiconductor device. As a result, the phenomenon known as quantum mechanical tunneling occurs between the degenerate regions of opposite conductivity type during the operation of the tunnel diode, and the latter exhibits a negative resistance region in its current-voltage characteristic when it is forwardly biased. This phenomenon, together with the tunneling characteristic of the diode, avoid the problem of shortcoming of minority carrier drift time which is present in most semiconductor devices and makes the tunnel diode a fast-operating device which is desirable for many purposes such as high-speed switching and the generation of very-high-frequency oscillations.

A variety of semiconductor materials such as germanium, silicon, silicon carbide, and intermetallic compounds have been employed as the parent bodies or starting wafers in making tunnel diodes. The starting wafer is very often given a P-type conductivity by heavily doping it with an active impurity material, and this may be accomplished by a variety of techniques which are well known in the art. Heavy doping during crystal growth, the quenching of heavily doped solutions, and solid-state diffusion have all been practiced with materials such as germanium. It should be understood that N-type starting wafers may also be employed in tunnel diodes. At present, the best tunnel diodes are made by the alloy-junction technique for the production of an abrupt junction. When P-type semiconductor starting wafers of a material such as germanium are being utilized, the junction and its associated N-type recrystallized region are usually made degenerative by the application of a donor impurity such as arsenic in a carrier metal which may be tin or tin and lead. The material selected for the starting wafer is usually dictated by factors such as cost of materials, ease of fabrication, and the particular electrical characteristics desired for the tunnel diodes. For example, germanium tunnel diodes ordinarily have higher peak currents and peak-to-valley current ratios than such devices made of silicon which, on the other hand, have greater operating voltage swings. Intermetallic compounds such as gallium arsenide are materials which are capable of withstanding operation at high temperatures and usually are more costly than germanium or silicon but are desirable for many applications.

Heretofore in the fabrication of a tunnel diode by the alloying technique, a plurality of extremely small spheres or dots of alloy material having diameters of about 1 mil were positioned in predetermined places on a semiconductor wafer and alloyed therewith. The handling and the positioning of such small dots was a very delicate and time consuming manual operation. After alloying to form the tunneling junctions, the wafer was severed into individual diodes. Next each device was individually etched to reduce the size of the junction to the particular area which was instrumental in establishing the desired peak current and the desired N-shaped current-voltage characteristic for the device. The resulting cross-sectional dimension or diameter of the region about the junction then was but a few microns for values of peak current of 100 milliamperes or less. This etching operation also was considerably more time consuming and costly than is desired for many applications. Providing adequate mechanical support for the delicate filament of semiconductor material containing the junction was also a serious problem.

It is an object of the invention, therefore, to provide a new and improved method of fabricating tunnel diode devices which avoids one or more of the disadvantages of prior tunnel diode fabricating operations.

It is another object of the invention to provide a new and improved method of fabricating tunnel diode devices which is particularly suited to mass-production techniques.

It is a further object of the invention to provide a new and improved method of fabricating tunnel diode devices which is relatively simple and inexpensive.

Is is an additional object of the present invention to provide a new and improved method of simultaneosuly fabricating an array of quality semiconductor PN junction devices.

It is yet another object of the invention to provide a new and improved tunnel diode device which has an extremely small junction that is mechanically supported in a very sturdy manner.

It is also an object of the invention to provide a new and improved array of tunnel diodes which includes a plurality of individual diodes each having an alloy junction with a diameter of but a few microns that is very sturdily supported in a manner which reduces thermal expansion problems.

In accordance with the particular form of the invention, the method of simultaneously fabricating a plurality of semiconductor PN junction devices comprises establishing on selected portions of a surface of a semiconductor body of one conductivity type a plurality of adherent thin metal film members, and introducing the aforesaid body and members into a bath of molten material which has a temperature less than the melting point of the body and comprises (a) a conductivity-directing impurity that is of a type opposite to that of the body and has an affinity for the metal of the members and (b) a quantity of the aforesaid metal which substantially saturates the bath, whereby particles of the material adhere to the members. The method also includes removing the body, members and particles from the bath and cooling the assembly so that the particles are bonded to the members, and heating the assembly to the alloying temperature of the materials thereof and thereafter cooling the assembly to form on the body a plurality of PN junctions and recrystallized semiconductor regions of the opposite conductivity type.

Also in accordance with the invention, a tunnel diode device comprises a body of semiconductor material of a given conductivity type having an active impurity concentration in the range of $1 \times 10^{19}$ to $2 \times 10^{20}$ atoms/cu. cm., and a film of insulating material adherent to a surface of the body and having therein a pair of apertures of widely different lateral dimensions and extending through the film. The device also includes regions of semiconductor material of the opposite conductivity type and tunneling alloy junctions in the portions of the body exposed by the apertures, those junctions extending to the surface of the body under the film. The device further includes ohmic electrical connections to the aforesaid regions.

The foregoing and other objects, features and advantages of the invention will be apparent from the following more particular description of a preferred embodiment of the invention, as illustrated in the accompanying drawings.

Figure 1:
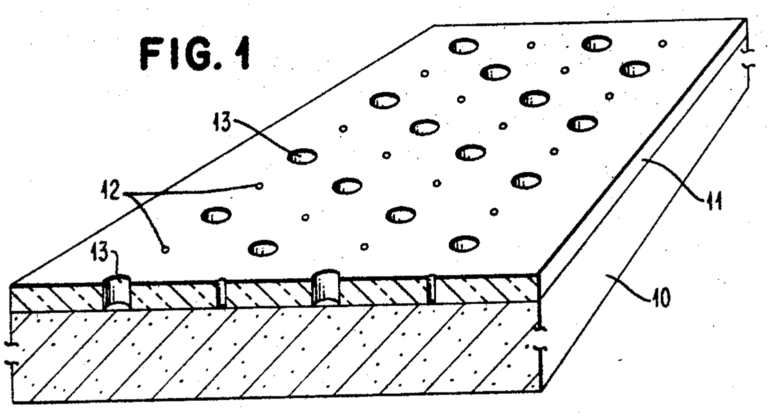
FIG. 1 is a perspective view of a semiconductor starting wafer with a perforated insulating film or coating thereon.

Referring now to FIG. 1 of the drawings, there is represented diagrammatically and to a greatly enlarged scale a semiconductor starting wafer or body 10 of one conductivity, which is useful in the microminiaturized fabrication of an array of semiconductor devices. To that end, the body 10 may be of a suitable semiconductor material such as germanium or gallium arsenide and may have dimensions of about 0.75 inch x 0.75 inch x 5 mils for the simultaneous fabrication of several hundred semiconductor diodes. The invention is particularly attractive in the fabrication of tunnel diodes and hence will be described in that environment, in which case the semiconductor body is degenerative. The body 10 has adherently attached or bonded to one surface thereof a passivating insulating film 11 having a plurality of apertures 12, 12 and 13, 13 therein which expose selected portions of that surface. The apertures 12, 12 may have a diameter of about 1 mil while that of the apertures 13, 13 is about 5 mils. The apertures are disposed in the alternate relationship represented.

While insulating films of various materials may be employed on the body 10, a very practical film has proved to be one of an oxide of silicon, such as silicon dioxide, or a composite film such as a first film of silicon dioxide having a thin glass sheet or film thereover. Composite films may be applied in the manner disclosed and claimed in the copending application of John A. Perri and Jacob Riseman, Ser. No. 141,669, filed Sept. 25, 1961, and entitled "Coated Objects and Methods of Providing the Protective Coverings Therefor," and assigned to the same assignee as the present invention. Briefly, this surface coating is accomplished by the thermal decomposition of a siloxane compound in the manner disclosed in Patent 3,089,793 to Eugene L. Jordan and Daniel J. Donahue, granted May 14, 1963, and entitled "Semiconductor Devices and Methods of Making Them," to form a film which is believed to be predominantly silicon dioxide on the surface of the body 10. This film may have a thickness of the order of 4000 angstroms. Thereafter a thin glass film, for example one about 2 microns in thickness, is applied to the silicon dioxide film by centrifuging the assembly in a suspension of finely divided glass particles to form a thin uniform layer of glass particles on the silicon dioxide film, and then chemically bonding the particles to the silicon dioxide film to produce a composite film. For simplicity of representation, such a composite film has been shown in FIG. 1 as the single film 11. The copending application of William A. Pliskin and Ernest E. Conrad, Ser. No. 141,668, filed Sept. 29, 1961, and entitled "Method of Forming A Glass Film on an Object and the Product Produced Thereby," and assigned to the same assignee as the present invention, discloses and claims the techniques for centrifuging the glass particles and thereafter forming them into a very thin hole-free glass film by heating the glass particles above the softening temperature of the particles.

Apertures 12, 12 and 13, 13 are formed at predetermined locations in the film by conventional photoengraving techniques. In the manner well known in the art, a photoengraving resist (not shown) is placed over the composite film 11 and the resist is then exposed through a master photographic plate having opaque areas corresponding to regions from which the film is to be removed. In the photographic development, the unexposed resist is removed and a corrosive fluid, such as a 20% nitric acid solution, is employed to remove the insulating film from the now exposed regions while the developed resist serves as a mask to prevent chemically etching of the insulating film areas that are to remain on the body 10. After the opening of the holes 12, 12 and 13, 13, the photoengraving resist is removed in a conventional manner.

Figure 2:
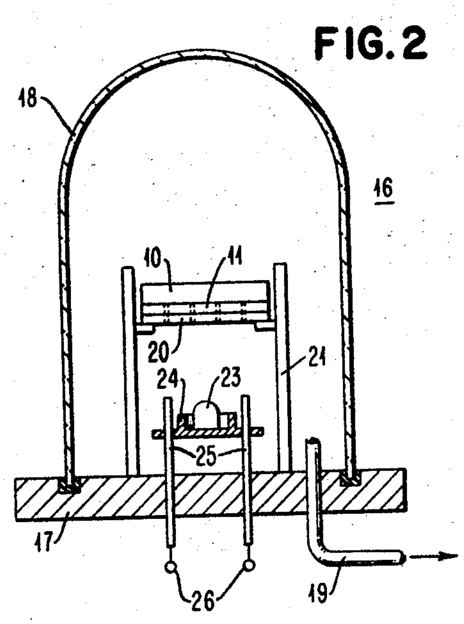
FIG. 2 is a sectional view of an evaporation chamber employed in one of the fabricating steps.

In the next operation there are established on selected portions of the upper surface of the semiconductor body 10 of one conductivity type a plurality of adherent thin metal film members 14, 14 and 15, 15. See FIG. 3. At this time it will be assumed that the semiconductor body is of the P conductivity germanium or gallium arsenide. It will be understood, however, that other semiconductor materials may be employed and that the body could be one of the N conductivity type. The film members 14, 14 and 15, 15 are preferably deposited by a vaporizing operation on the portions of the surface of the body 12 which are exposed by the apertures 12, 12 and 13, 13 in the insulating film 11. This may be accomplished in a known manner in a conventional vaporizer 16 such as the one represented diagrammatically in FIG. 2. The vaporizer includes a base 17 and a cover 18 that may be sealed thereto during the evacuation of air from its chamber through a tube 19. The unit of FIG. 1 rests in an inverted position on an apertured mask 20 of a metal such as molybdenum which in turn rests on a suitable support 21. The apertures in the mask conform in size and in position with those in the film 11, and are in registration therewith. Metal 23 to be vaporized on the surface of the body 10 exposed by the apertures 12, 12 and 13, 13 in the film is heated in a filament cup 24 which is connected to a source of electrical energy through a pair of supporting leads 25, 25 and terminals 26, 26. When the semiconductor body 10 is made of germanium, a suitable material for the film members 14, 14 and 15, 15 is silver, gold or copper. Gold or silver are useful when the semiconductor body is an intermetallic material such as gallium arsenide. Silver has proven to be particularly attractive for use with both semiconductor materials.

Figure 3:
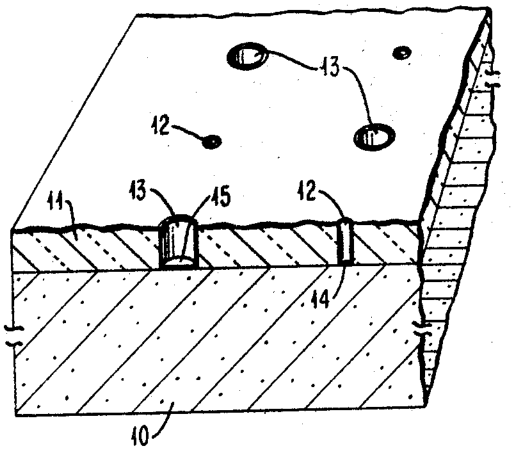
FIG. 3 is a greatly enlarged perspective view of a portion of the starting wafer after its removal from the chamber of FIG. 2.

Next, the unit of FIG. 3 is preferably, although not necessarily, momentarily immersed in a conventional solder flux bath. Thereafter it is preferably, though not necessarily, heated gradually to about 200° C. on a heater such as a hot plate. Then the hot unit is introduced into a bath 27 (see FIG. 4) of a molten material which has a temperature less than the melting point of the body 10 and comprises (a) a conductivity-directing impurity of a type opposite to that of the body and has an affinity for the metal of the members 14, 14 and 15, 15 and (b) a quantity or piece 28 of the above-mentioned metal such as silver which substantially saturates the bath, whereby particles of the molten material of the bath adhere to those members. When the semiconductor body is P-type germanium, the molten bath comprises the conductivity-directing N-type impurity arsenic in a carrier metal such as tin, 2% arsenic by weight and the balance tin may be employed, or 2% tin and the balance tin and lead in the ratio of 3 to 2, respectively, may also be used in the bath which is maintained at a temperature of about 225° C. When the semiconductor body 10 is P-type gallium arsenide, the molten bath comprises the N-type impurity tin, selenium, tellurium or sulphur with indium or gold as the carrier metal. The bath may include about 1% by weight of the doping impurity and the balance the carrier metal and is held in the range of about 225–280° C. Good results have also been obtained with baths containing 5% tin by weight and the balance gold. The bath may also be of pure tin. Baths containing 0–70% gold and the balance tin may be used; the higher the gold content of the bath, the higher temperature thereof. When the unit is removed from the molten bath, which hereinafter will be referred to as the solder bath, droplets 29, 29 and 30, 30 (see FIG. 5) of solder rest in the apertures 12, 12 and 13, 13 and cling tenaciously to the thin film members 14, 14 and 15, 15. Surface tension forces cause the molten solder to ball up above the upper surface of the film 17 and, upon solidification after removal of the unit from the bath, to appear as protruding droplets.

Figure 4:
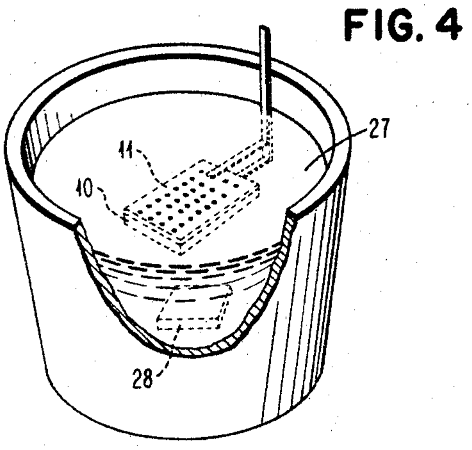
FIG. 4 is a perspective view employed in explaining a dipping operation which is practiced.

At this time, it is desirable to consider further the metals employed as the film members 14, 14 and 15, 15 and the metals in the molten bath 27. The metal for use as the film members should be one which has an affinity for the metals in the molten bath 27 so as to promote the lodging and adherence of droplets of the bath material in apertures 12, 12 and 13, 13 in the insulating film 11. Also, in an alloying operation to be described subsequently, the metal of the film should have a sufficiently high solubility in droplets of the solder bath that it will dissolve completely in and alloy with those droplets. Silver, for example, is an excellent metal having such characteristics. In FIG. 4, the piece of silver 28 is employed in the molten bath 27 to insure that the latter is supersaturated with silver in order that the bath material will not, during the described dipping operation, dissolve the silver constituting the film members 14, 14 and 15, 15.

In the next operation the assembly which was removed from the solder bath is heated to the alloying temperature of the semiconductor body and the metal adherent thereto. The assembly is placed for about two minutes in an alloying furnace containing a nonoxidizing atmosphere and maintained at a temperature of the order of 500–600° C. Upon removal from the furnace and cooling, there are formed in the semiconductor body a plurality of abrupt tunneling junctions 31, 31 and 34, 34 such as the two represented in FIG. 5, together with recrystallized semiconductor regions 33, 33 and 32, 32 of the opposite or N conductivity type. When the semiconductor body 10 is P-type germanium, the film members 14, 14 and 15, 15 are gold and the solder droplets 29 and 30 are arsenic and tin, during the alloying operation the silver melts and alloys with the arsenic and the tin, the tin wets the semiconductor material in contact therewith, dissolves some of it, and the arsenic imparts the N-type conductivity to the molten semiconductor material which thereafter recrystallizes. When the semiconductor body 10 is P-type gallium arsenide, the silver film members alloy with the molten droplets, the carrier metal gold or silver, as the case may be, dissolve the semiconductor material thereunder and the dopant imparts an N-type conductivity to the molten semiconductor material which thereafter solidifies. When the bath contains substantially pure tin, the tin serves as the semiconductor solvent and doping material. The junctions 31 and 34 formed between the degenerate N and P-type regions are very abrupt and are capable of exhibiting quantum mechanical tunneling. The composite insulating film 11 is one which is capable of withstanding the alloying temperatures mentioned above.

Figures 5, 6, 7:
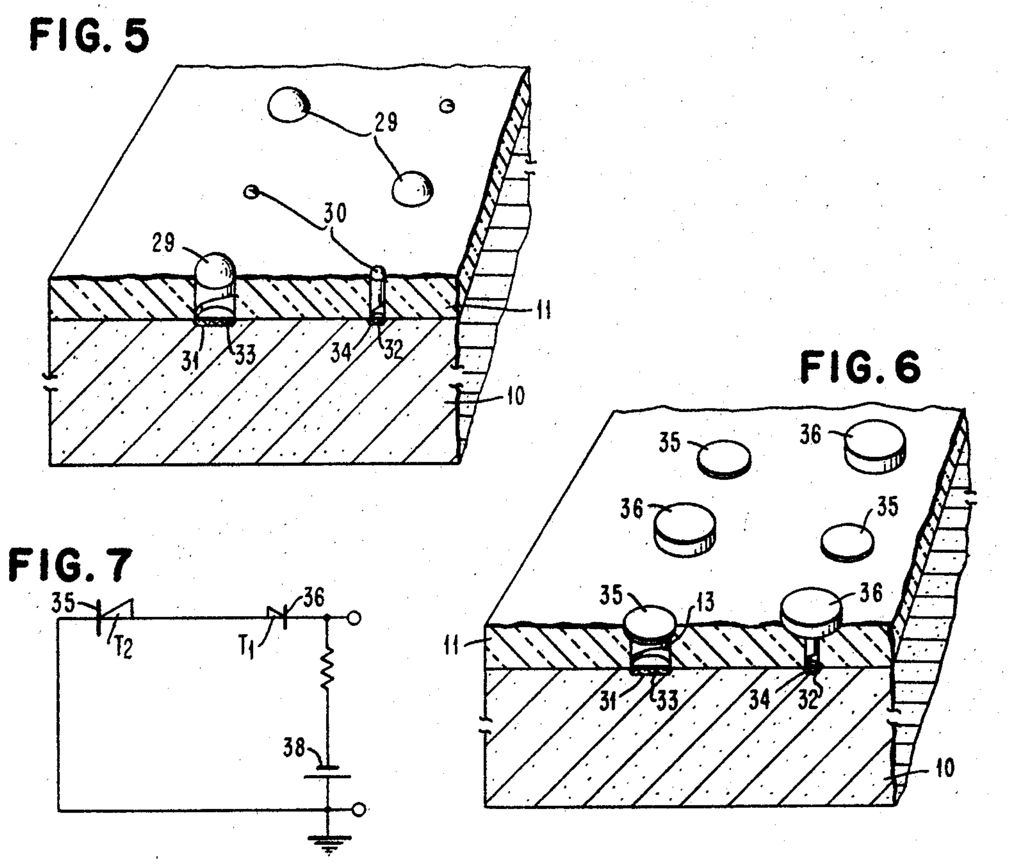
FIG. 5 is a perspective view of a portion of the device after the FIG. 4 operation.
FIG. 6 is another perspective view of that portion of the device after a subsequent operation.
FIG. 7 is a circuit diagram showing the manner in which a tunnel diode device constructed in accordance with the invention may be connected in an electrical circuit.

In the next operation the droplets 29, 29 and 30, 30 of solder in the apertures 12, 12 and 13, 13 are removed with an etching solution that dissolves the solder but does not attack the recrystallized regions 33, 33 and 32, 32. A 20% solution of either nitric acid or hydrochloric acid is useful for this purpose. In a subsequent vaporizing operation, a metal having a higher melting point than the solder droplets is evaporated in a conventional manner so as to make ohmic contacts with the recrystallized regions 32, 32 and 33, 33 and to form on the surface of the film 11 terminals 35, 35 and 36, 36 as represented in FIG. 6. When the semiconductor body 10 is made of germanium, a gold-antimony alloy containing about 2% antimony and the balance gold may be selectively evaporated. When the body 10 is made of gallium arsenide, gold is a suitable high temperature material for forming the ohmic contacts and terminals.

The tunneling junctions 34, 34 are those which are to be employed because of the negative resistance characteristics of the diodes associated therewith. As thus far described, their peak-current carrying capacities are purposely greater than the final value thereof. The assembly or unit of FIG. 6 is then heated for a predetermined time and at a predetermined temperature above that of the molten bath and below the melting point of the terminals 35, 35 and 36, 36 to cause a diffusion of the impurities across the abrupt junctions 31, 31 and 34, 34 and a consequent widening thereof. This in turn decreases the peak-current carrying capacities of the tunnel diode devices associated with the junctions 34, 34 to substantially a predetermined value. The necessary thermal cycle for this diffusion operation can be determined empirically by measuring the rate of decrease of the peak current associated with the junctions 34, 34 for various temperatures. For example, it has been found that for certain germanium tunnel diodes that the change in peak current with temperature at 400° C. is equal to a decrease of 1 milliampere per minute. Once the rate of change has been determined empirically for a sample tunnel diode corresponding to the ones being fabricated, the peak current of an array of such tunnel diodes may be tailored to a desired value by a heat treating operation in the vicinity of about 400° C.

For some applications it may be desirable to heat treat the array of junctions 34, 34 en mass, as explained above, to achieve an approximate peak current carrying capacity for the diodes, and thereafter to heat treat the diodes individually to realize the desired rated peak currents. In the latter instance, the array would be severed in a conventional manner as by ultrasonic cutting into a plurality of tunnel diodes, each comprising a structure which included the terminals 35 and 36 and the junction regions associated therewith. Thereafter the heat treatment or junction thermal tailoring operations could be carried out in the manner explained above to secure the precise peak current values which were desired.

Figure 8:
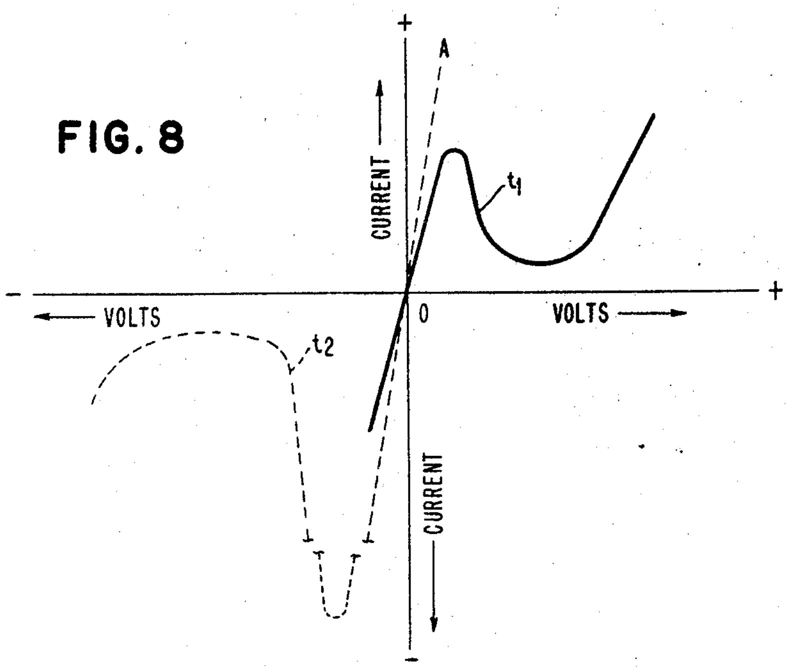
FIG. 8 shows characteristic curves used in explaining the various connections of the tunnel diode devices represented in FIG. 7.

Assuming now that we are dealing with a tunnel diode which has been fabricated in the manner explained above and includes a pair of terminals 35 and 36, if the device is connected in a simplified circuit such as that represented in FIG. 7, it will exhibit the characteristics represented in FIG. 8. The tunnel diode device actually includes two tunnel diodes, designated $T_1$ and $T_2$ in FIG. 7, which correspond to the diodes associated with the junctions 34 and 31, respectively, shown in FIG. 6. The smaller diode $T_1$ is biased in the forward direction by a battery 38 while the larger diode $T_2$ is biased in the opposite sense. The characteristic of the diode $T_1$ is represented in FIG. 8 by the full-line curve $t_1$ while that of the diode $T_2$ is shown by the broken-line curve $t_2$. Diode $T_1$ is employed so that it operates in the negative resistance region of its characteristic. Diode $T_2$ is employed so that it does not operate in its negative resistance region but rather operates in the region O-A where it presents a very low resistance and hence serves as an ohmic contact. Thus the diode $T_2$ and its tunneling junction are employed so that the diode serves as an excellent current conductor in a circuit which includes the tunnel diode $T_1$. It will be seen, therefore, that the procedure of the present invention simultaneously forms two groups of tunneling junctions, the negative resistance characteristic of one group of which may be conveniently employed while the low ohmic characteristic of the other group may be utilized. This fabrication procedure effects a desired saving in manufacturing steps, time and materials.

From the foregoing description and explanation, it will be seen that the method of fabricating semiconductor devices in accordance with the invention offers a number of important advantages. The dip soldering and alloying steps permit the simultaneous production of a large number of semiconductor devices such as tunnel diodes in an economical manner and by relatively unskilled personnel. The use of a protective insulating film having apertures formed therein of a predetermined size to receive the impurity-containing solder is (1) instrumental in establishing the peak current carrying capacity of the junctions without any delicate junction-etching operations, (2) is effective to passivate and protect those junctions and (3) eliminates the problem of providing adequate mechanical support of delicate tunneling junctions.

While the invention has been shown and described with reference to a preferred embodiment thereof, it will be understood by those skilled in the art that various changes in form and details may be made therein without departing from the spirit and scope of the invention.

What is claimed is:

1. A tunnel diode device comprising:

a body of semiconductor material of a given conductivity type having an active impurity concentration in the range of $1\times10^{19}$ to $2\times10^{20}$ atoms/cu. cm.;

A film of insulating material adherent to said surface of said body and having therein a pair of apertures of widely different lateral dimensions and extending through said film;

a pair of regions of alloy semiconductor material having substantially equal impurity concentrations of the opposite conductivity type forming a pair of tunneling junctions respectively with the portions of said body exposed by said pair of apertures, said junctions extending to said surface of said body under said film whereby said junctions provide a pair of tunnel diodes, reversely coupled by said body;

ohmic electrical connections to said regions; and, a voltage source applied across said connections providing an operating voltage to the tunnel diode formed in the smaller aperture at which said smaller diode operates in the negative resistance region of its characteristic, and an operating voltage to the tunnel diode formed in the larger aperture at which said larger diode operates in the positive resistance region of its characteristic.

2. The tunnel diode device of claim 1 wherein said insulating material is silicon oxide.

3. The tunnel diode device of claim 1 wherein one of the apertures has a diameter of about 5 mils and the other of about 1 mil.

4. The tunnel diode device of claim 1 wherein said insulating material comprises a film of silicon dioxide adherent to the said surface of said body and a glass film chemically bonded to such silicon dioxide film, said film having therein a pair of aligned apertures of widely different lateral dimensions and extending through said films.

References Cited

UNITED STATES PATENTS

| | | | |
|---|---|---|---|
| 2,972,092 | 2/1961 | Nelson | 317—235 |
| 3,160,534 | 12/1964 | Oroshnik | 148—177 |
| 3,237,064 | 2/1966 | Tiemann | 317—234 |
| 3,325,703 | 6/1967 | Rutz | 317—234 |
| 3,027,501 | 3/1962 | Pearson | 317—234 |

JOHN W. HUCKERT, Primary Examiner

M. EDLOW, Assistant Examiner

U.S. Cl. X.R.

317—235